(12) United States Patent
Avci et al.

(10) Patent No.: US 10,535,770 B2
(45) Date of Patent: Jan. 14, 2020

(54) SCALED TFET TRANSISTOR FORMED USING NANOWIRE WITH SURFACE TERMINATION

(71) Applicant: Intel Corporation, Santa Clara, CA (US)

(72) Inventors: Uygar E. Avci, Portland, OR (US); Rafael Rios, Portland, OR (US); Kelin J. Kuhn, Aloha, OR (US); Ian A. Young, Portland, OR (US); Justin R. Weber, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/505,558

(22) PCT Filed: Sep. 24, 2014

(86) PCT No.: PCT/US2014/057258
§ 371 (c)(1),
(2) Date: Feb. 21, 2017

(87) PCT Pub. No.: WO2016/048306
PCT Pub. Date: Mar. 31, 2016

(65) Prior Publication Data
US 2017/0271501 A1    Sep. 21, 2017

(51) Int. Cl.
*H01L 29/06* (2006.01)
*H01L 29/78* (2006.01)
(Continued)

(52) U.S. Cl.
CPC ............ *H01L 29/785* (2013.01); *B82Y 10/00* (2013.01); *H01L 29/068* (2013.01);
(Continued)

(58) Field of Classification Search
CPC ... H01L 29/785; H01L 29/2003; H01L 29/24; H01L 29/16; H01L 29/0673; H01L 29/66795; H01L 29/068
(Continued)

(56) References Cited

U.S. PATENT DOCUMENTS 9,287,359 B1 *   3/2016  Arnold ................ H01L 29/0673
2002/0050608 A1   5/2002  Landheer et al.
(Continued)

FOREIGN PATENT DOCUMENTS

CN      103824885      5/2014
EP       2378557      10/2011

OTHER PUBLICATIONS

International Search Report and Written Opinion for PCT/US14/57258 dated Jun. 16, 2015, 10 pages.
(Continued)

*Primary Examiner* — Mohammad M Hoque
(74) *Attorney, Agent, or Firm* — Green, Howard & Mughal LLP

(57) ABSTRACT

Described is a TFET comprising: a nanowire having doped regions for forming source and drain regions, and an undoped region for coupling to a gate region; and a first termination material formed over the nanowire; and a second termination material formed over a section of the nanowire overlapping the gate and source regions. Described is another TFET comprising: a first section of a nanowire having doped regions for forming source and drain regions, and an undoped region for coupling to a gate region; a second section of the nanowire extending orthogonal to the first section, the second section formed next to the gate and source regions; and a termination material formed over the first and second sections of the nanowire.

12 Claims, 7 Drawing Sheets

(51) Int. Cl.
  *H01L 29/739* (2006.01)
  *B82Y 10/00* (2011.01)
  *H01L 29/16* (2006.01)
  *H01L 29/20* (2006.01)
  *H01L 29/24* (2006.01)
  *H01L 29/66* (2006.01)

(52) U.S. Cl.
  CPC ...... *H01L 29/0669* (2013.01); *H01L 29/0673* (2013.01); *H01L 29/16* (2013.01); *H01L 29/2003* (2013.01); *H01L 29/24* (2013.01); *H01L 29/66795* (2013.01); *H01L 29/7391* (2013.01)

(58) Field of Classification Search
  USPC .......................................................... 257/30
  See application file for complete search history.

(56) References Cited

U.S. PATENT DOCUMENTS

| | | | | |
|---|---|---|---|---|
| 2006/0157692 | A1* | 7/2006 | Wada | H01L 51/0022 257/40 |
| 2007/0176824 | A1* | 8/2007 | Stumbo | H01Q 3/34 342/372 |
| 2008/0067495 | A1 | 3/2008 | Verhulst | |
| 2010/0087013 | A1* | 4/2010 | Lieber | B82Y 10/00 436/525 |
| 2010/0289031 | A1* | 11/2010 | Teraji | H01L 21/0435 257/77 |
| 2011/0253981 | A1* | 10/2011 | Rooyackers | B82Y 10/00 257/24 |
| 2012/0115296 | A1 | 5/2012 | Vandenberghe et al. | |
| 2012/0146053 | A1* | 6/2012 | Saitoh | H01L 29/66795 257/77 |
| 2014/0138744 | A1 | 5/2014 | Kotlyar et al. | |
| 2014/0144881 | A1* | 5/2014 | Lee | H01L 29/0673 216/100 |
| 2014/0239418 | A1 | 8/2014 | Wang et al. | |
| 2016/0064221 | A1* | 3/2016 | Colinge | H01L 29/1033 257/192 |
| 2017/0040443 | A1* | 2/2017 | Lemaitre | B82Y 10/00 |
| 2017/0170331 | A1* | 6/2017 | Liang | H01L 29/7848 |
| 2017/0236951 | A1* | 8/2017 | Sun | H01L 29/8122 257/76 |

OTHER PUBLICATIONS

Extended European Search Report for European Patent Application No. 14902484.6, dated Mar. 29, 2018.

Ansari, Lida et al., "A Proposed Confinement Modulated Gap Nanowire Transistor Based on Metal (Tin)", Nano Letters, vol. 12, No. 5, Apr. 27, 2012, pp. 2222-2227.

Borg, Mattias et al., "Topical Review;Synthesis adn properties of antimonide nanowires;Synthesis and properties of antimonide nanowires", Nanotechnology, IOP, Bristol, GB, vol. 24, No. 20, Apr. 19, 2013, p. 202001.

Mohammad, Noor S., "Understanding quantum confinement in nanowires: basics, applications and possible laws", Journal of Physics: Condensed Matter, Institute of Physics Publishing, Bristol, GB, vol. 26, No. 42, Sep. 23, 2014, p. 423202.

Non-Final Office Action from Taiwan Patent Application No. 104126888 dated Feb. 20, 2019, 9 pgs.

* cited by examiner

SCALED TFET TRANSISTOR FORMED USING NANOWIRE WITH SURFACE TERMINATION

CLAIM OF PRIORITY

This application is a National Phase Application of, and claims priority to, PCT Application No. PCT/US14/57258, filed on 24 Sep. 2014, titled "SCALED TFET TRANSISTOR FORMED USING NANOWIRE WITH SURFACE TERMINATION", which is incorporated by reference in its entirety for all purposes.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased processing capacity. The drive for ever-more processing capacity, however, is not without issue. The necessity to optimize the performance and energy consumption of each device becomes increasingly significant.

In the manufacture of IC devices, multi-gate transistors, such as tri-gate transistors, have become more prevalent as device dimensions continue to scale down. Many different techniques have been attempted to reduce leakage of transistors. However, significant improvements are still needed in the area of leakage suppression.

As the size of transistors in ICs continues to decrease, the power supply voltage to the transistors must also decrease. As the power supply voltage decreases, the threshold voltage of the transistors in the ICs must also decrease. Lower threshold voltages are difficult to obtain in conventional metal-oxide-semiconductor field-effect transistors (MOSFETs) because, as the threshold voltage is reduced, the ratio of ON-current to OFF-current ($I_{on}/I_{off}$) also decreases. The ON-current refers to the current through a MOSFET when a gate voltage applied is above the threshold voltage and could be as high as equal to the supply voltage, and the OFF-current refers to current through a MOSFET when a gate voltage applied is below the threshold voltage and equals zero volts.

Tunneling Field Effect Transistors (TFETs) are promising devices in that they promise significant performance increase and energy consumption decrease due to a steeper sub-threshold slope (i.e., smaller sub-threshold swing). The current TFET devices suffer from lower currents than Si-MOSFETs at the same technology node.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1B:
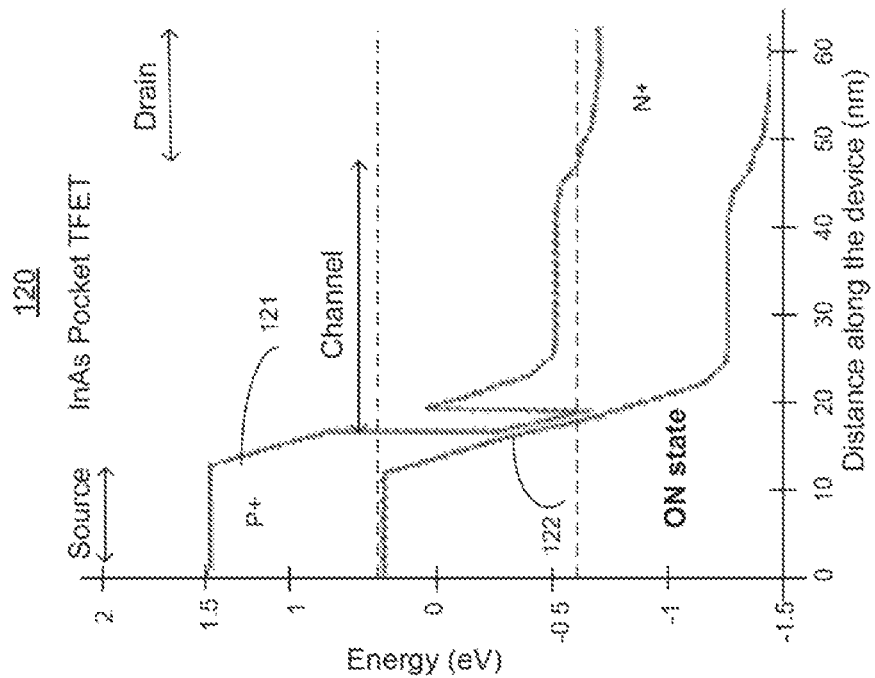
FIG. 1B illustrates a band diagram of a TFET.
Figure 1A:
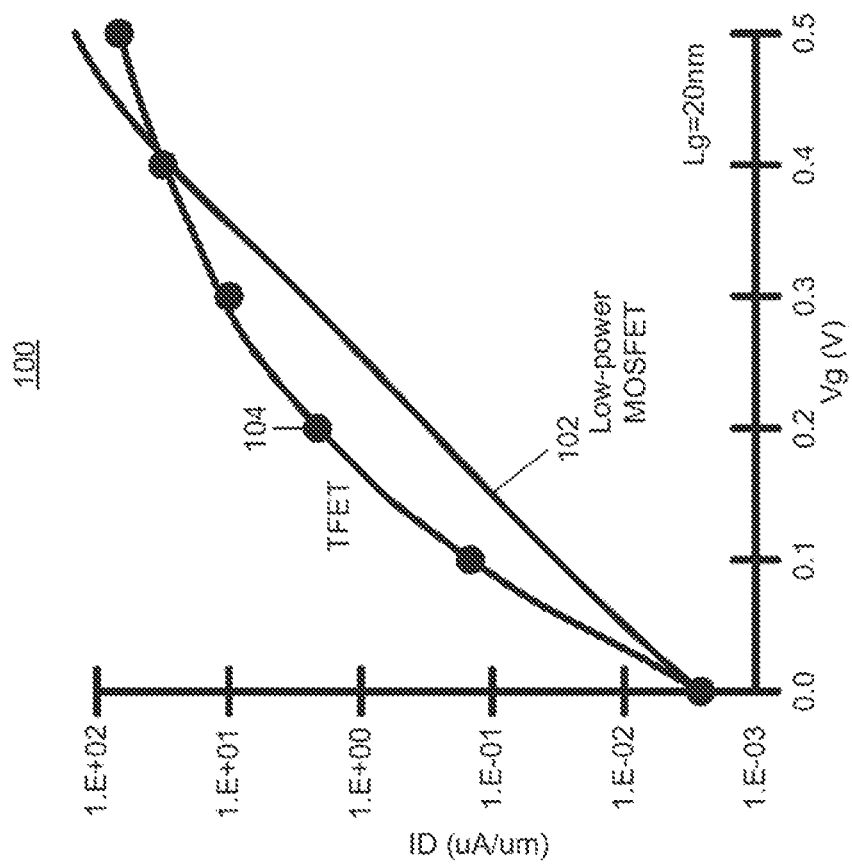
FIG. 1A illustrates a plot showing Id vs. Vg curves for MOSFETs and TFETs.

FIG. 1A illustrates a plot 100 showing Id vs. Vg curves for MOSFETs and TFETs. Here, plot 100 includes an x-axis of gate voltage values, and a y-axis of drain current values (normalized to channel width). Curve 102 represents the voltage-current characteristics of a MOSFET, while curve 104 represents the voltage-current characteristics of a TFET.

Lower threshold voltages are difficult to obtain in conventional MOSFETs because, as the threshold voltage is reduced, the ratio of ON-current to OFF-current ($I_{on}/I_{off}$) also decreases. As referred here, $I_{on}$ refers to the current through a transistor when a gate voltage applied is above the threshold voltage and could be as high as equal to the supply voltage, and $I_{off}$ refers to current through a transistor when a gate voltage applied is below the threshold voltage and equals zero volts.

A MOSFET's sub-threshold slope (SS) or sub-threshold swing (i.e., rate of increase of current from $I_{off}$ to $I_{on}$ and defined as $SS=[1e3/[d \log 10(I)/dV_g]]^{-1}$) has a theoretical limit of 60 mV/dec at room temperature, meaning that the supply voltage cannot be significantly reduced while maintaining the high $I_{on}/I_{off}$ ratio. SS is the number of mV it takes to change the current by one decade. Any target $I_{off}$ value is determined by the transistor's standby power requirement; for example, a transistor having a theoretical sub-threshold swing of zero would be able to operate at very low applied voltage giving a low standby power. $I_{off}$ values are important parameters for low-power standby applications (e.g., mobile computing devices).

Furthermore, for low active-power applications, it is favorable to operate at lower supply voltages because of the active-power's strong dependence on supply voltage; however, due to the MOSFET sub-threshold slope limit of 60 mV/dec, when these transistors are operated at low supply voltages, $I_{on}$ is significantly lower because it may be operating close to the threshold-voltage. Here, curve 102 is shown to have a relatively low current rate of current increase, where about 0.5V is needed to switch to $I_{on}$. TFETs may achieve sharper turn-ON behavior (i.e., a steeper slope) and improved $I_{on}/I_{off}$ ratios compared to MOSFETs.

FIG. 1B illustrates a band diagram of a TFET. Here, x-axis is distance 'x' from the source region of TFET to the drain region TFET, and y-axis is energy E of conduction and valance bands in electron Volt (eV). Curve 121 is the conduction band and curve 122 is the valance band.

In the OFF state, there is a wide potential barrier between the source and the channel of the n-TFET, and as a result, no tunneling occurs. Here, OFF state occurs when the gate of the TFET is coupled to a low power supply (e.g., ground). When the gate voltage is increased and exceeds the threshold voltage, the potential barrier between the source and the channel of the n-TFET becomes narrow enough to allow a significant tunneling current (i.e., switching to the ON state).

In some embodiments, when body dimensions reduce and fall in the 1 nm range, use of low bandgap (or no-bandgap) materials that form bandgaps at very small dimensions becomes an attractive alternative. Some embodiments describe a physical mechanism to achieve a high performing TFET device using metals. As body dimensions shrink down to approx. 1 nm, semimetals, silicides, and alloys form bandgaps and behave like semiconductors.

The bandgap energy can be modulated with the choice of thickness of these nanowire materials, according to some embodiments. At very thin body dimensions, the band structure and electrical properties strongly depend on the interface bond terminations. In some embodiments, by changing the surface terminations and body thicknesses along the device, a hetero-junction TFET device is formed that exhibits the desired band properties.

There are several advantages of various embodiments. For example, semimetals are intrinsically suitable to deliver just the right amount of bandgap at dimensions (due to their confinement) that are useful (or required) for highly scaled transistor generations. Conversely, semiconductors may have too high bandgap coupled with high effective mass and low density of states. Another advantage of some embodiments is that termination chemistry along the device and body dimension (along the device) could be used with only one type of channel material to create the desired band structure. Conversely, semiconductor TFET may require high-quality hetero-junction (e.g., two different materials) growth to deliver these properties.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area, reduced in parasitic capacitance, and increase in performance. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 2A:
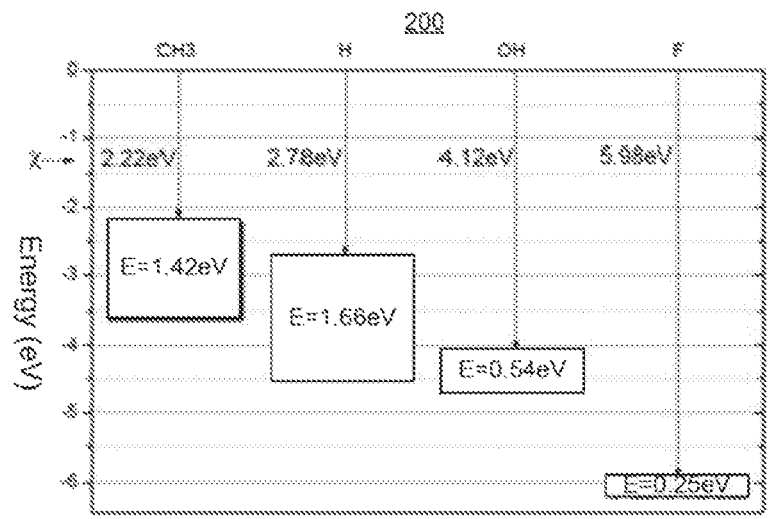
FIG. 2A illustrates a plot showing energy levels for various kinds of termination materials for a 1 nm Sn wire.

FIG. 2A illustrates a plot 200 showing energy levels for various kinds of termination materials for thin semimetal, alloy, or silicide wire (e.g., Sn nanowire with approx. 1 nm diameter). Here, y-axis is energy in eV, and x-axis is the thickness of the metal with four different termination chemistries (e.g., $CH_3$, H, OH, and F). The '0' level on the y-axis is the free electron energy level. The arrow from the '0' energy level for each termination material indicates the energy needed by the electron to be free (i.e., work function or electron affinity). For example, electron needs 2 eV to approx. 4 eV of energy to free itself from $CH_3$ terminated Sn wire; electron needs 2.5 eV approx. 4.5 eV of energy to free itself from H terminated Sn wire depending on the metal thickness.

Figure 2B:
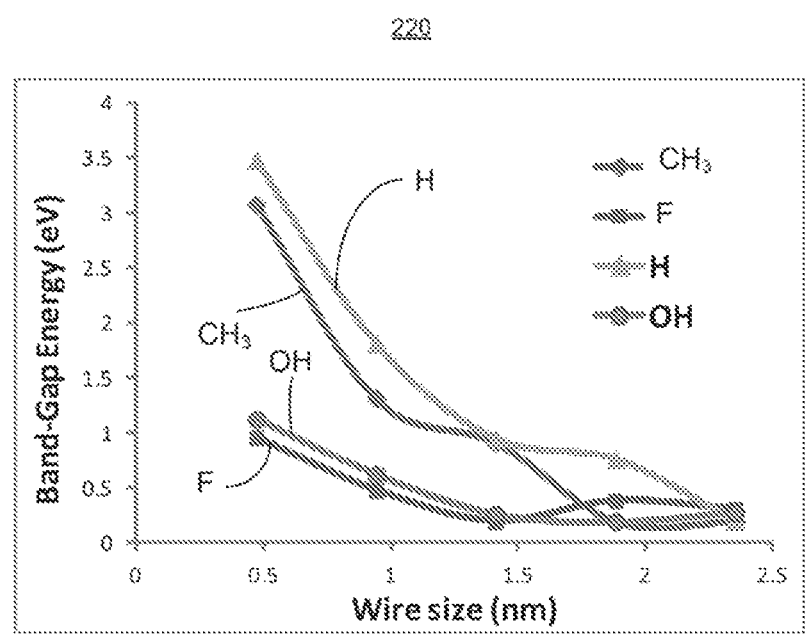
FIG. 2B illustrates a plot showing bandgap energy for various termination materials as function of wire size, according to some embodiments.
Figure 2C:
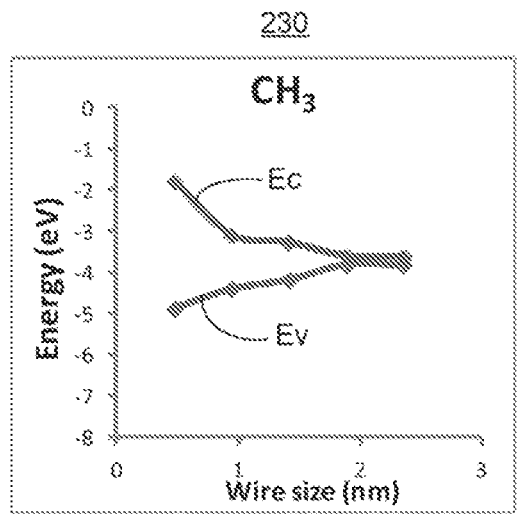
FIGS. 2C-F illustrate plots showing conduction and valance energies for various termination materials as function of wire size, according to some embodiments.
Figure 2D:
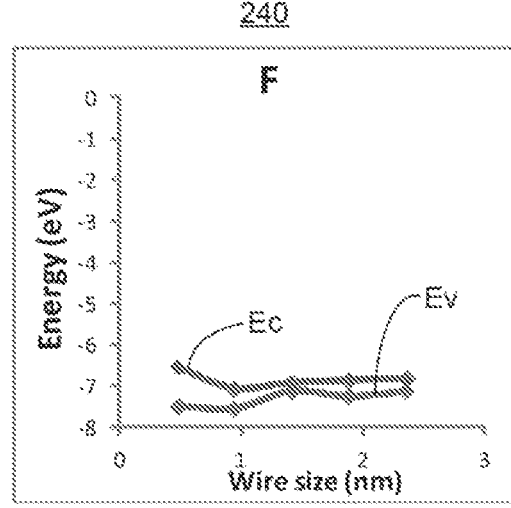
Figure 2E:
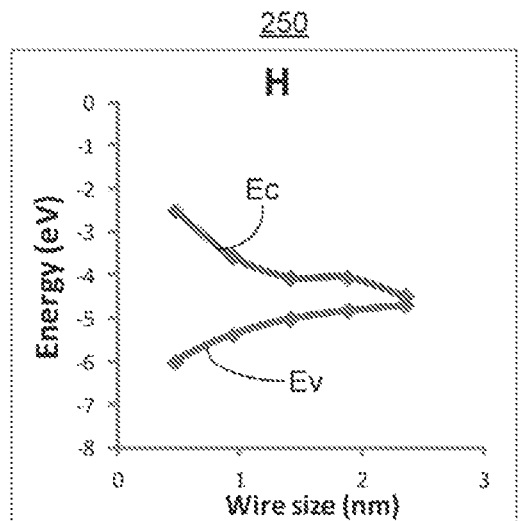
Figure 2F:
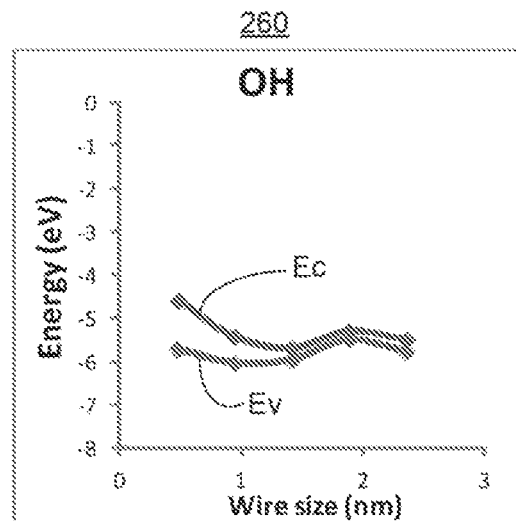

FIG. 2B illustrates plot 220 showing bandgap energy for four different termination chemistries (e.g., $CH_3$, H, OH, and F) as function of wire size (i.e., thickness), according to some embodiments. Here, x-axis is wire size (i.e., thickness) in nm and y-axis is bandgap energy in eV. As wire thickness increases, bandgap energy reduces.

FIGS. 2C-F illustrate plots 230, 240, 250, and 260 showing conduction and valance energies for various termination materials as function of wire size, according to some embodiments. Here, x-axis is the wire size (i.e., thickness) in nm and y-axis is the bandgap energy in eV. Each plot includes two waveforms—one representing conduction energy band (Ec) and the other representing valance energy band (Ev) for Sn material when one of the termination materials (i.e., $CH_3$, F, H, and OH) is used.

In these examples, bandgap of Sn is 1.308 eV when $CH_3$ is used as termination material over Sn; bandgap of Sn is 1.806 eV when H is used as termination material over Sn; bandgap of Sn is 0.617 eV when OH is used as termination material over Sn; and bandgap of Sn is 0.472 eV when F is used as termination material over Sn at 0.94 nm thickness.

Figure 3A:
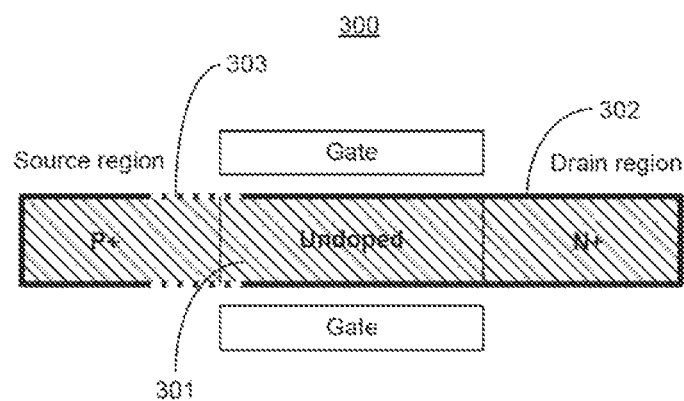
FIG. 3A illustrates a TFET device formed using a metal nanowire having different surface terminations in a horizontal process, according to some embodiments of the disclosure.

FIG. 3A illustrates a TFET device 300 formed using a metal nanowire having different surface terminations in a horizontal process, according to some embodiments of the disclosure. It is pointed out that those elements of FIG. 3A having the same reference numbers (or names) as the elements of any other figure can operate or function in any manner similar to that described, but are not limited to such.

In some embodiments, TFET device 300 includes a nanowire formed using a semimetal (e.g., Sn, As, Bi, Sb, graphite, etc.), an alloy (e.g., TiN, TaN, TiAlC, etc.), or a silicide (e.g., NiSi, TiSi, CoSi, etc.) indicated by region 301. The following embodiments are described with reference to region 301 being a semimetal formed from Sn. However, the same description is also applicable to other materials.

In some embodiments, region 301 is doped such that one region (here, to the left) is doped P+ to form a source region and another region (here, to the right) is doped N+ to form a drain region. The un-doped region of 301 (here, largely in the middle between the source and drain regions) forms the channel. Gate terminal(s) are formed over the un-doped region. In some cases, where the semimetal, alloy, or silicide used for forming the nanowire region 301 may not be easily doped with P+ and N+. In some embodiments, semiconductor materials may be used for the source and drain regions to enable P/N material instead of Sn nanowire. In some embodiments, Sn nanowire is used for the un-doped region 301.

In some embodiments, two different termination materials are used over region 301. The first termination material is 302 and the second termination material is 303. In some embodiments, first termination material 302 covers substantially the entire region 301 except for a short segment between the source and the gate regions as shown. In some embodiments, that short segment is terminated using second termination material 303. In some embodiments, second termination material 303 overlaps the gate region and the source region. In some embodiments, both the bandgap and work-function (i.e., electron affinity) of the material can be modified by using different surface terminations. In some embodiments, first and second termination materials (302 and 303) are $CH_3$, H, OH, and F such that the first and second termination materials are of different types.

In this example embodiment, first termination material 302 is H and second termination material 303 is OH. With these termination materials, in some embodiments, the bandgap of Sn in region 301 (under the Sn nanowire) is 1.806 eV with 3.575 eV electron affinity; and the bandgap of Sn in region 301 (under the Sn nanowire) shrinks to 0.617 eV with 5.422 eV electron affinity.

This change in properties is used to make a broken or staggered gap TFET (i.e., a hetero-junction TFET), according to some embodiments. In some embodiments, by using different termination chemistry at the area 303, a desired band-structure for an ideal TFET can be achieved even at these thin body dimensions.

Homo-junction semiconductor TFETs refers to TFETs without a pocket region coupled to the source region and with the same material all the way along the device (e.g., GeSn material all the way along the device). However, drive current $I_D$ output for homo-junction semiconductor TFETs is less than drive current $I_D$ output of n-type hetero-junction semiconductor TFET. Hetero-junction semiconductor TFETs are TFETs with a pocket coupled to the source region. Hetero-junction can also be created by a change in semiconductor material at the source. In some embodiments, a high performing scaled hetero-junction TFET is formed using different thicknesses of nanowire and a one-type termination layer (e.g., FIG. 6) or using a uniform nanowire and at least two termination layers as shown in FIG. 3. While the embodiments are described with reference to n-type TFET, p-type TFET can be constructed in a similar way but using different material combinations, according to some embodiments.

Figure 3B:
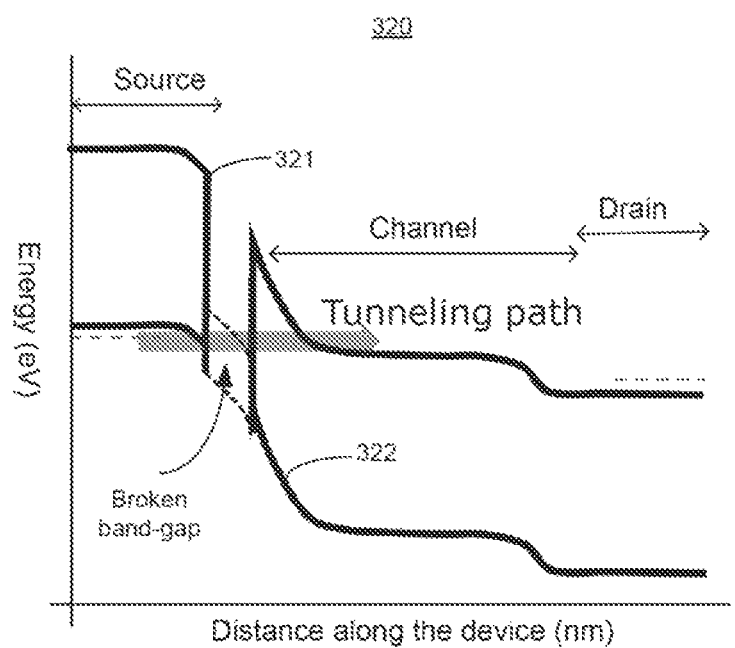
FIG. 3B a band diagram of the TFET of FIG. 3A, according to some embodiments of the disclosure.

FIG. 3B a band diagram 320 of TFET 300 of FIG. 3A, according to some embodiments of the disclosure. It is pointed out that those elements of FIG. 3B having the same reference numbers (or names) as the elements of any other figure can operate or function in any manner similar to that described, but are not limited to such.

Here, x-axis is distance 'x' from the source region of TFET 300 to the drain region of TFET 300, and y-axis is the energy of conduction and valance bands in eV. Here, the numbers on the energy scale indicate the distance from the vacuum level. Curve 321 is the conduction band and curve 322 is the valance band. The termination materials used with the Sn nanowire show a TFET operating with the behavior of a broken gap TFET (i.e., like a hetero-junction TFET).

FIGS. 4A-D illustrate process 400, 420, 430, and 440 of fabricating a TFET device (e.g., device 300) formed using a metal nanowire having different surface terminations in a horizontal process, according to some embodiments of the disclosure. It is pointed out that those elements of FIGS. 4A-D having the same reference numbers (or names) as the elements of any other figure can operate or function in any manner similar to that described, but are not limited to such.

Figure 4A:
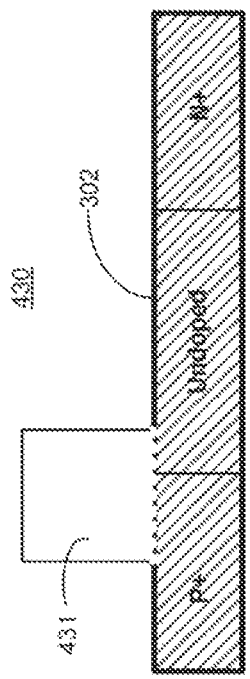
FIGS. 4A-D illustrate a process of fabricating a TFET device formed using a metal nanowire having different surface terminations in a horizontal process, according to some embodiments of the disclosure.

FIG. 4A illustrates an Sn nanowire of 1 nm diameter. In some embodiments, a section of Sn nanowire 301 is P+ doped to form a source area using standard lithography process. In some embodiments, a section of Sn nanowire 301 is N+ doped to form a drain area using a standard lithography process. In some embodiments, Sn nanowire 301 is kept un-doped between the source and drain regions to form a channel. In some embodiments, semiconductor materials may be used for the source and drain regions to enable P/N material instead of Sn nanowire.

Figure 4C:
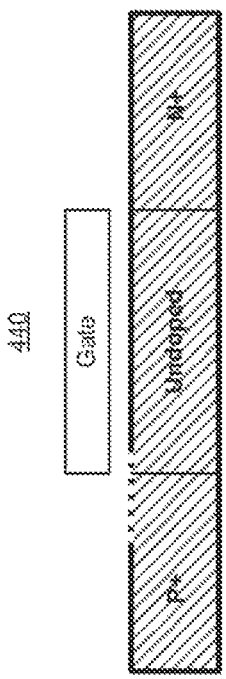
Figure 4B:
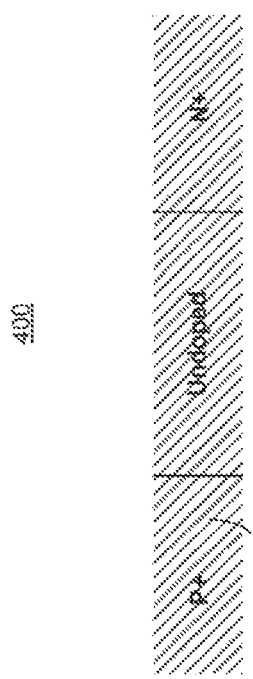
Figure 4D:
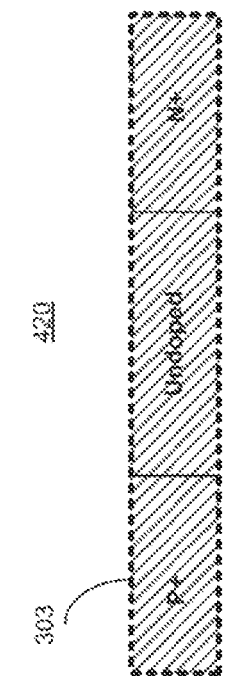

FIG. 4B illustrates Sn nanowire is first terminated with OH only (i.e., second termination material) 303 for all interfaces. FIG. 4C illustrates an Sn nanowire in which a spacer 431 is then positioned between the source region and the un-doped region, and the OH termination material is etched away from all interfaces except for the interface under the spacer. In some embodiments, H only material 302 is used to terminate the etched surface. After spacer 431 is removed, all interfaces of Sn nanowire are terminated with H only material 302 except for the region previously under spacer 431. FIG. 4D illustrates an Sn nanowire with a gate terminal formed over the un-doped region.

In some embodiments, the processes described with reference to FIGS. 4B-D are modified such that initially the entire Sn nanowire is terminated using the first termination material (e.g., H-only material). Then a gate terminal is formed over the un-doped region of the Sn nanowire. Then a second termination is completed or formed. Then spacer 431 is added which is self-aligned to the gate and the initial termination is processed again. This will provide the terminations same as shown in FIG. 4D.

Figure 5:
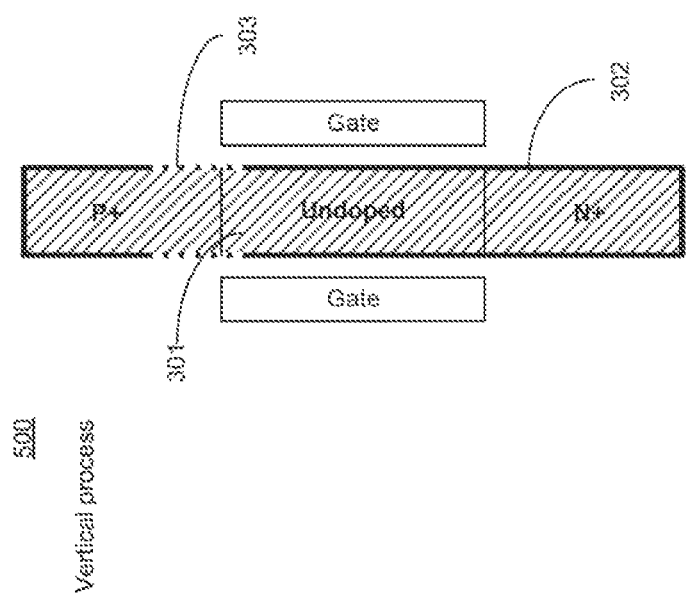
FIG. 5 illustrates a TFET device formed using a metal nanowire having different surface terminations in a vertical process, according to some embodiments of the disclosure.

FIG. 5 illustrates a TFET device 500 formed using a metal nanowire having different surface terminations in a vertical process, according to some embodiments of the disclosure. It is pointed out that those elements of FIG. 5 having the same reference numbers (or names) as the elements of any other figure can operate or function in any manner similar to that described, but are not limited to such. So as not to obscure the embodiments of FIG. 5, differences between FIG. 3 and FIG. 5 are described.

Here, in some embodiments, a TFET device formed using a metal nanowire having different surface terminations is fabricated using a vertical process instead of a horizontal process described for FIG. 3 with reference to FIGS. 4A-D. The operation and performance of TFET 500 is otherwise substantially the same as the operation and performance of TFET 300.

Figure 6:
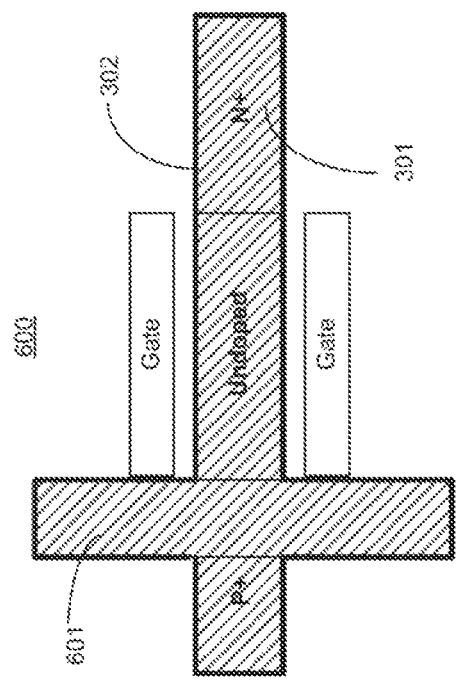
FIG. 6 illustrates a TFET device formed using a metal nanowire having a surface termination and thicker metal wire in the source-channel junction, according to some embodiments of the disclosure.

FIG. 6 illustrates a TFET device 600 formed using a metal nanowire having a surface termination and thicker metal wire in the source-channel junction, according to some embodiments of the disclosure. It is pointed out that those elements of FIG. 6 having the same reference numbers (or names) as the elements of any other figure can operate or function in any manner similar to that described, but are not limited to such.

In some embodiments, the desired band-structure for the TFET device can be achieved by changing the device dimensions along the device. In some embodiments, Sn nanowire 301 is made thicker near the source-channel junction (e.g., region 601) than the channel region (e.g., 301). This change in nanowire thickness forms a broken gap like TFET device that behaves like a hetero-junction TFET. In some embodiments, the thickness of the Sn nanowire and the type of termination material 302 is combined to achieve the desired TFET band structure. In some embodiments, the thicker portion of the Sn nanowire is formed by growing Sn near the source and gate region. Here, the thicker portion 601 of the nanowire is orthogonal to the other portion 301 of the nanowire.

In some embodiments, device 600 can be processed similar to the process described with reference to FIG. 4. In some embodiments, after process of FIG. 4B, a thick Sn is grown or deposited over the source region. Then a spacer is added similar to that described with reference to FIG. 4C and then the region without the source region is etched to achieve the thin nanowire close to the source end.

Figure 7:
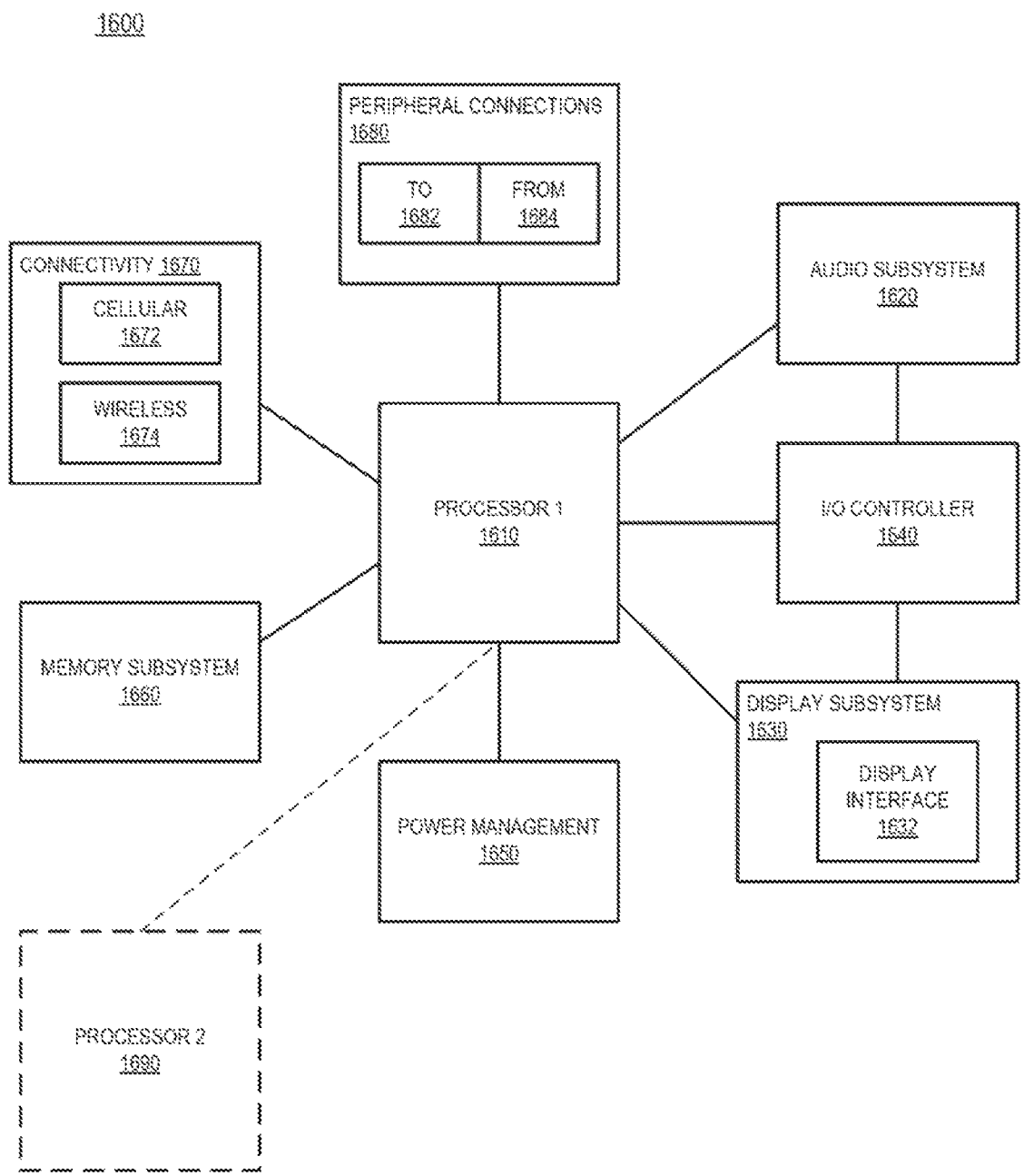
FIG. 7 is a smart device or a computer system or a SoC (System-on-Chip) using TFETs, according to some embodiments of the disclosure.

FIG. 7 is a smart device or a computer system or a SoC (System-on-Chip) using TFET devices, according to some embodiments of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smartphone, a wireless-enabled e-reader, or other wireless mobile device. It will be understood that certain components are shown generally, and not all components of such a device are shown in computing device 1600.

In some embodiments, computing device 1600 includes a first processor 1610 with TFET devices, according to the embodiments discussed. Other blocks of the computing device 1600 may also include the TFET devices of the embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600.

Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a TFET is provided which comprises: a nanowire having doped regions for forming source and drain regions, and an un-doped region for coupling to a gate region; and a first termination material formed over the nanowire; and a second termination material formed over a section of the nanowire overlapping the gate and source regions. In some embodiments, the nanowire is one of: semimetal; alloy; or silicide. In some embodiments, the semimetal is one of: Sn, As, Bi, Sb, or graphite. In some embodiments, the alloy is one of: TiN, TaN, or TiAlC. In some embodiments, the silicide is one of: NiSi, TiSi, or CoSi. In some embodiments, the first and second termination materials are different materials. In some embodiments, the first and second termination materials are formed using one of: $CH_3$, H, OH, or F.

In another example, a system is provided which comprises: a memory; a processor coupled to the memory, the processor having a TFET according to the TFET described above; and a wireless interface for allowing the processor to couple to another device. In some embodiments, the system comprises a display interface for allowing a display unit to display content processed by the processor.

In another example, a TFET is provided which comprises: a first section of a nanowire having doped regions for forming source and drain regions, and an un-doped region for coupling to a gate region; a second section of the nanowire extending orthogonal to the first section, the second section formed next to the gate and source regions; and a termination material formed over the first and second sections of the nanowire. In some embodiments, the first and second sections of the nanowire are formed using one of: semimetal; alloy; or silicide. In some embodiments, the semimetal is one of: Sn, As, Bi, Sb, or graphite. In some embodiments, the alloy is one of: TiN, TaN, or TiAlC. In some embodiments, the silicide is one of: NiSi, TiSi, or CoSi. In some embodiments, the termination materials are formed using one of: $CH_3$, H, OH, or F.

In another example, a system is provided which comprises: a memory; a processor coupled to the memory, the processor having a TFET according to the TFET described above; and a wireless interface for allowing the processor to couple to another device. In some embodiments, the system comprises a display interface for allowing a display unit to display content processed by the processor.

In another example, a method is provided for forming a TFET device, the method comprising: doping a nanowire for forming source and drain regions in the nanowire; forming a gate region over an un-doped region of the nanowire; depositing a first interface layer of first termination material over the nanowire; and depositing a second interface layer of second termination material over the nanowire, the second interface layer overlapping the gate and source regions. In some embodiments, the nanowire is one of: semimetal; alloy; or silicide. In some embodiments, the semimetal is one of: Sn, As, Bi, Sb, or graphite. In some embodiments, the alloy is one of: TiN, TaN, or TiAlC. In some embodiments, the silicide is one of: NiSi, TiSi, or CoSi. In some embodiments, the first and second termination materials are different materials. In some embodiments, the first and second termination materials are formed using one of: $CH_3$, H, OH, or F.

In another example, an apparatus for forming a TFET device, the apparatus comprising: means for doping a nanowire for forming source and drain regions in the nanowire; means for forming a gate region over an un-doped region of the nanowire; means for depositing a first interface layer of first termination material over the nanowire; and means for depositing a second interface layer of second termination material over the nanowire, the second interface layer overlapping the gate and source regions. In some embodiments, the nanowire is one of: semimetal; alloy; or silicide.

In some embodiments, the semimetal is one of: Sn, As, Bi, Sb, or graphite. In some embodiments, the alloy is one of: TiN, TaN, or TiAlC. In some embodiments, the silicide is one of: NiSi, TiSi, or CoSi. In some embodiments, the first and second termination materials are different materials. In some embodiments, the first and second termination materials are formed using one of: $CH_3$, H, OH, or F.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A tunneling field effect transistor (TFET) comprising:
 a nanowire having doped regions for forming source and drain regions, and an un-doped region for coupling to a gate region; and
 a first termination material formed over the nanowire; and
 a second termination material formed over a section of the nanowire overlapping the gate and source regions.

2. The TFET of claim 1, wherein the nanowire is one of:
 semimetal;
 alloy; or
 silicide.

3. The TFET of claim 2, wherein the semimetal is one of: Sn, As, Bi, Sb, or graphite.

4. The TFET of claim 2, wherein the alloy is one of: TiN, TaN, or TiAlC.

5. The TFET of claim 2, wherein the silicide is one of: NiSi, TiSi, or CoSi.

6. The TFET of claim 1, wherein the first and second termination materials are different materials.

7. A system comprising:
 a memory;
 a processor coupled to the memory, the processor including a transistor which includes:
  a first section of a nanowire having doped regions for source and drain regions, and an un-doped region to couple to a gate region;
  a second section of the nanowire that extends orthogonal to the first section, the second section adjacent to the gate and source regions; and
  a material over the first and second sections of the nanowire, wherein the material includes one of: CH3, H, OH, or F; and
 a communication interface to allow the processor to communicate with another device.

8. The system of claim 7, wherein the first and second sections of the nanowire include one of:
 semimetal;
 alloy; or
 silicide.

9. The system of claim 8, wherein the semimetal includes one of: Sn, As, Bi, Sb, or graphite.

10. The system of claim 8, wherein the alloy of Ti includes one of: TiN, TaN, or TiAlC.

11. The system of claim 8, wherein the silicide includes one of: NiSi, TiSi, or CoSi.

12. The system of claim 7, wherein the transistor is a heterojunction tunneling field effect transistor.

* * * * *